(12) United States Patent
Muranaka et al.

(10) Patent No.: US 9,171,829 B2
(45) Date of Patent: Oct. 27, 2015

(54) PHOTOCOUPLER

(71) Applicant: Kabushiki Kaisha Toshiba, Minato-ku, Tokyo (JP)

(72) Inventors: Tetsuya Muranaka, Kitakyushu Fukuoka (JP); Yuichi Ikedo, Kanazawa Ishikawa (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/461,755

(22) Filed: Aug. 18, 2014

(65) Prior Publication Data

US 2015/0262982 A1 Sep. 17, 2015

(30) Foreign Application Priority Data

Mar. 14, 2014 (JP) ................................. 2014-052579

(51) Int. Cl.
| | |
|---|---|
| H01L 31/16 | (2006.01) |
| H01L 31/0203 | (2014.01) |
| H01L 25/16 | (2006.01) |
| H01L 31/167 | (2006.01) |
| H01L 31/0216 | (2014.01) |

(52) U.S. Cl.
CPC ............ *H01L 25/165* (2013.01); *H01L 25/162* (2013.01); *H01L 25/167* (2013.01); *H01L 31/02162* (2013.01); *H01L 31/167* (2013.01)

(58) Field of Classification Search
None
See application file for complete search history.

(56) References Cited

U.S. PATENT DOCUMENTS

| | | | | |
|---|---|---|---|---|
| 5,665,983 | A * | 9/1997 | Nagano | 257/81 |
| 2010/0192858 | A1* | 8/2010 | Honda et al. | 118/727 |
| 2010/0327629 | A1* | 12/2010 | Suga et al. | 296/200 |

FOREIGN PATENT DOCUMENTS

| | | |
|---|---|---|
| JP | 10-324981 A | 12/1998 |
| JP | 2002-141325 A | 5/2002 |
| JP | 2003-209212 A | 7/2003 |
| JP | 2012-041403 A | 3/2012 |

* cited by examiner

*Primary Examiner* — Khaja Ahmad
(74) *Attorney, Agent, or Firm* — White & Case LLP

(57) ABSTRACT

A photocoupler includes: a light emitting element; a light receiving element; an inner resin layer; and an outer resin layer. The light emitting element is driven by an input electrical signal. The light receiving element is configured to convert emission light of the light emitting element into an electrical signal. The inner resin layer includes a base resin and a curing agent. The base resin contains isocyanuric acid having an epoxy group. The curing agent contains an acid anhydride having an acid anhydride group. The inner resin layer covers the light emitting element and the light receiving element. Then outer resin layer encloses the inner resin layer and configured to block the emission light. Carbon atomic concentration increases and oxygen atomic concentration decreases with distance in depth direction of the inner resin layer from an interface.

12 Claims, 7 Drawing Sheets

PHOTOCOUPLER

CROSS-REFERENCE TO RELATED APPLICATIONS

This application is based upon and claims the benefit of priority from Japanese Patent Application No. 2014-052579, filed on Mar. 14, 2014; the entire contents of which are incorporated herein by reference.

FIELD

Embodiments described herein relate generally a photocoupler.

BACKGROUND

In a photocoupler used in an environment at high temperature and high humidity, the sealing resin is required to have higher heat resistance and moisture resistance.

In a photocoupler in which the optical semiconductor element is sealed with resin, peeling and the like occurring at the resin interface of the double mold structure may degrade the reliability due to water absorption and oxidation.

Another problem is the change of optical coupling efficiency and the like by the change of optical intensity due to peeling and discoloration of the resin.

DETAILED DESCRIPTION

In general, according to one embodiment, a photocoupler includes: a light emitting element; a light receiving element; an inner resin layer; and an outer resin layer. The light emitting element is driven by an input electrical signal. The light receiving element is configured to convert emission light of the light emitting element into an electrical signal for output. The inner resin layer includes a base resin and a curing agent. The base resin contains isocyanuric acid having an epoxy group. The curing agent contains an acid anhydride having an acid anhydride group. The inner resin layer covers the light emitting element and the light receiving element. The outer resin layer encloses the inner resin layer and configured to block the emission light. Carbon atomic concentration increases and oxygen atomic concentration decreases with distance in depth direction of the inner resin layer from an interface between the inner resin layer and the outer resin layer.

Embodiments of the invention will now be described with reference to the drawings.

Figure 1:
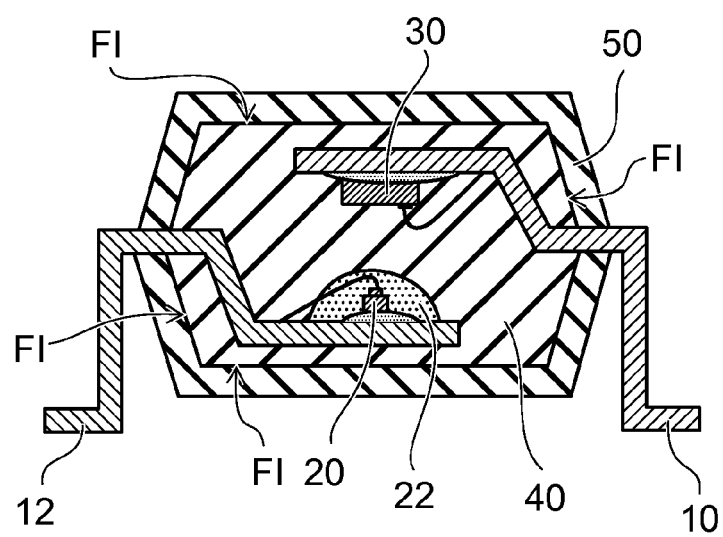
FIG. 1 is a schematic sectional view of a photocoupler according to a first embodiment.

FIG. 1 is a schematic sectional view of a photocoupler according to a first embodiment.

In the photocoupler, a light emitting element 20 bonded to a first lead 12 and a light receiving element 30 bonded to a second lead 10 are opposed to each other. The light emitting element 20 is covered with a potting resin 22 for encapsulation.

The photocoupler is configured as a double mold structure of an inner resin 40 and an outer resin 50. The inner resin 40 has translucency for visible to infrared light. The outer resin 50 encloses the inner resin 40, one end of the first lead 12, and one end of the second lead 10. The outer resin 50 has light blocking property for the wavelength of emission light of the light emitting element 20 such as a light emitting diode.

The other end of the first lead 12 and the other end of the second lead 10 are projected from the outer resin 50 and constitute external connection terminals. The inner resin 40 and the outer resin 50 are each configured as a mold body. This enables downsizing and high volume productivity of the photocoupler.

The first lead 12 constituting an input terminal and the second lead 10 constituting an output terminal are electrically insulated from each other and can transmit an electrical signal. That is, the photocoupler functions as an optical coupling type insulating circuit.

The inner resin 40 is a resin in which a base resin containing isocyanuric acid and having an epoxy group is polymerized with a curing agent containing an acid anhydride having an acid anhydride group. For example, the isocyanuric acid includes 1,3,5-tris(2,3-epoxypropyl)isocyanuric acid. And the acid anhydride includes isomethyltetrahydrophthalic acid anhydride.

The outer resin 50 is a resin in which a base resin of orthocresol novolac (OCN) resin is polymerized with a curing agent of phenol novolac resin.

The inner resin 40 and the outer resin 50 can be blended with an inorganic filler. Examples of the blended filler can include silicas such as fused silica and crystalline silica, alumina, silicon nitride, and aluminum nitride. The shape thereof can be e.g. linear or spherical. Malfunctions and noise due to disturbance light can be suppressed if the outer resin layer 50 is configured to have light blocking property.

The inner resin 40 is blended with a first filler at a first blending ratio of e.g. 60 weight % or more and 85 weight % or less. The outer resin 50 is blended with a second filler at a second blending ratio of e.g. 60 weight % or more and 85 weight % or less. The difference between the first blending ratio and the second blending ratio is set to 5 weight % or more and 12 weight % or less. The amount of either filler may be larger. The first filler and the second filler may be of the same material and shape.

Addition of wax containing a release agent to the resin mold body can facilitate releasing from the mold after molding and improve productivity. In the inner resin 40, an external lubricant wax having low polarity and an internal lubricant wax having high polarity can be mixed. The internal lubricant wax having high polarity can be e.g. a fatty acid such as stearic acid, palmitic acid, behenic acid, and arachidic acid. The external lubricant wax having low polarity can be e.g. a fatty acid ester such as a stearic acid ester, a palmitic acid ester, a behenic acid ester, and an arachidic acid ester.

In the first embodiment, the surface of the inner resin 40 is subjected to surface modification by oxygen plasma processing. This enhances the adhesion strength at the interface FI between the inner resin 40 and the outer resin 50.

Figure 2A:
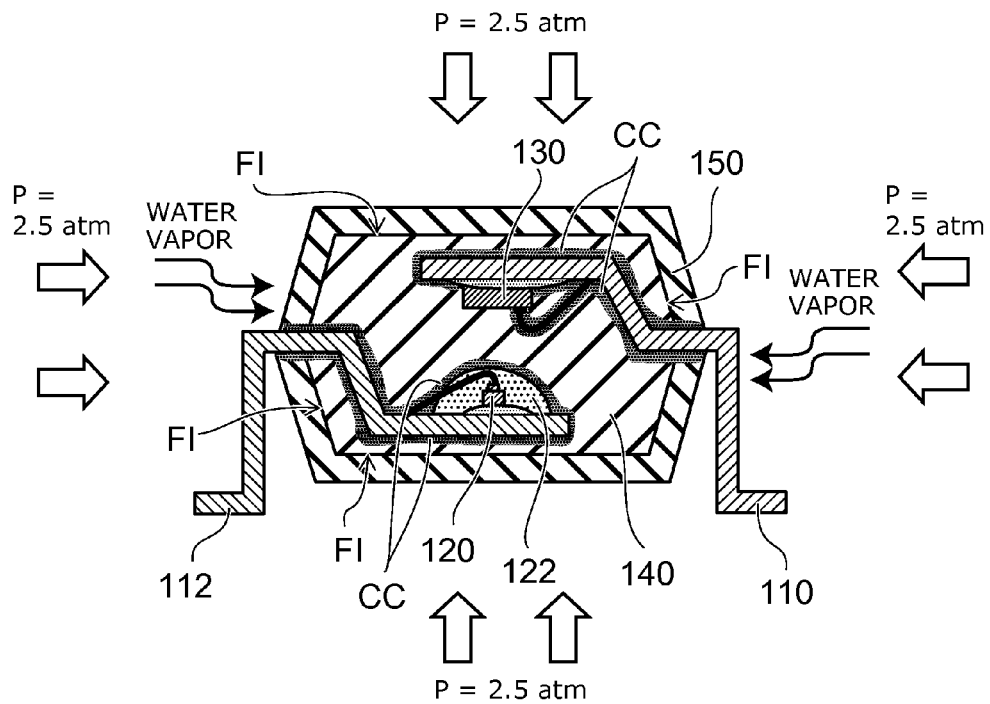
FIG. 2A is a schematic sectional view of a photocoupler according to a comparative example.
Figure 2B:
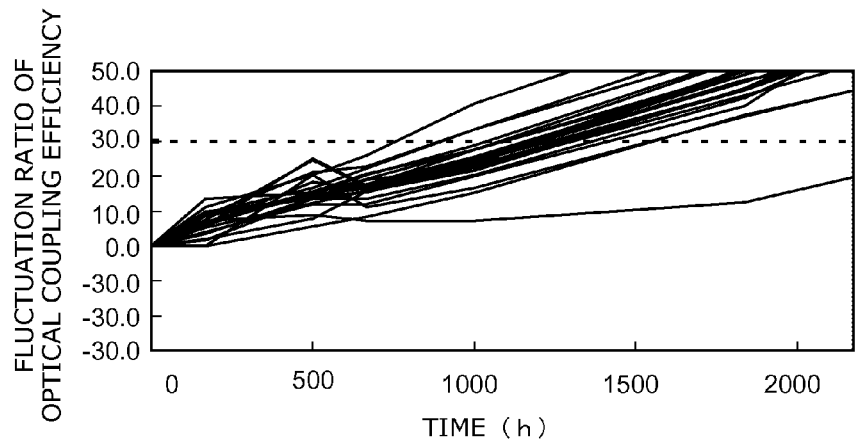
FIG. 2B is a graph showing the fluctuation ratio of the optical coupling efficiency thereof.

FIG. 2A is a schematic sectional view of a photocoupler according to a comparative example. FIG. 2B is a graph showing the fluctuation ratio of the optical coupling efficiency thereof.

As shown in FIG. 2A, in the photocoupler, a light emitting element 120 bonded to a first lead 112 and a light receiving element 130 bonded to a second lead 110 are opposed to each other. The light emitting element 120 is covered with a potting resin 122 for encapsulation. In the comparative example, the surface of the inner resin 40 is not subjected to surface modification by plasma processing.

The inner resin 140 is a resin in which a base resin containing isocyanuric acid and having an epoxy group is polymerized with a curing agent containing an acid anhydride having an acid anhydride group. Peeling occurred at the interface FI between the inner resin 140 and the outer resin 150, and caused water absorption and oxidative discoloration. In FIG. 2A, the oxidatively discolored region CC at the resin interface and the interface between the resin and the lead frame is indicated by dots.

FIG. 2B is a graph showing the fluctuation ratio of optical coupling efficiency due to PCT (pressure cooker test) in the photocoupler according to the comparative example. The light emitting element 120 is caused to emit light. The light receiving element 130 is supplied with a prescribed voltage. For instance, the fluctuation ratio of the optical coupling efficiency can be determined by measuring the current of the light receiving element 130 after PCT.

In PCT, for instance, the photocoupler is placed in an atmosphere of saturated water vapor at 2.5 atm and 127° C. Then, water vapor is squeezed into the resin. Next, the atmosphere is set to 1 atm and 100° C. or more. Then, water vapor molecules taken in the resin move freely and increase the resin volume. Furthermore, the atmosphere is set to 1 atm and 25° C. Then, water vapor turns into water and decreases the resin volume. This produces a starting point of peeling. Furthermore, by reflow at 260° C., when the water constituting the starting point of peeling turns into water vapor, a gap occurs by e.g. water vapor explosion.

As shown in FIG. 2B, the transmittance decreases after the photocoupler is left standing for 90 hours in an atmosphere of 200° C. As a result, the fluctuation ratio of the optical coupling efficiency amounts to 28-48% after the lapse of 1500 hours in an atmosphere of 150° C.

Figure 3:
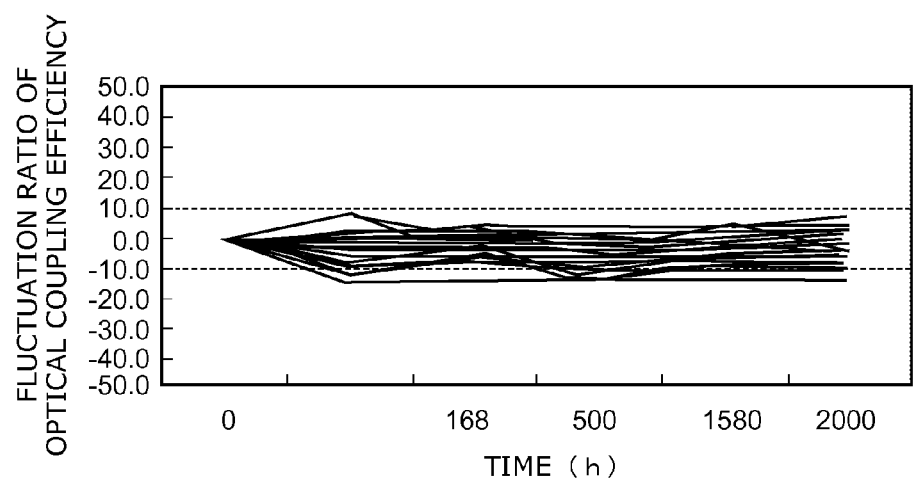
FIG. 3 is a graph showing the fluctuation ratio of optical coupling efficiency due to PCT in the first embodiment.

FIG. 3 is a graph showing the fluctuation ratio of optical coupling efficiency due to PCT in the first embodiment.

The variation ratio after the lapse of 2000 hours in an atmosphere of 150° C. lies between +10% and −10%. This is significantly improved relative to the comparative example. No peeling occurred between the inner resin layer 40 and the outer resin layer 50, and no discoloration occurred.

Figure 4:
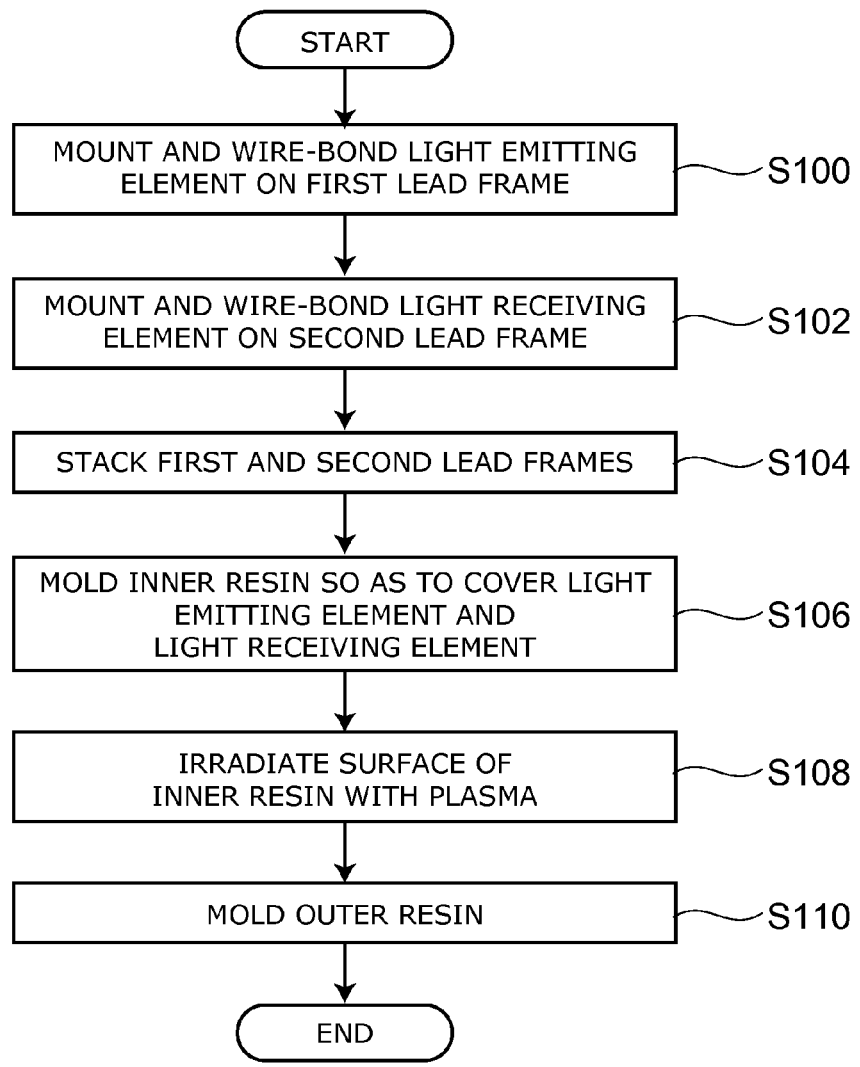
FIG. 4 is a flow chart of a method for manufacturing a photocoupler according to the first embodiment.

FIG. 4 is a flow chart of a method for manufacturing a photocoupler according to the first embodiment.

A light emitting element 20 is mounted on a first lead frame and subjected to wire bonding (S100). Subsequently, the light emitting element 20 may be covered with a potting resin 22.

On the other hand, a light receiving element 30 is mounted on a second lead frame and subjected to wire bonding (S102). Either the step S100 or the step S102 may be performed first.

Next, the light emitting element 20 and the light receiving element 30 are stacked so as to be opposed to each other. The first lead frame and the second lead frame are joined by e.g. electric welding (S104).

Next, an inner resin layer 40 is molded so as to cover the light emitting element 20 and the light receiving element 30 (S106).

Next, the surface of the inner resin layer 40 is irradiated with plasma (S108). The plasma irradiation is performed by using a radio frequency plasma irradiation apparatus to generate oxygen plasma. The condition is that e.g. the radio frequency power is 500 W and the irradiation time is 30 minutes. In this case, multiple patterning lead frames can be arranged in a plurality of magazines and housed in the processing chamber. This improves volume productivity.

Next, an outer resin layer 50 is molded so as to cover the inner resin layer 40, one end of the first lead 12, and one end of the second lead 10 (S110). Subsequently, photocouplers are singulated by lead cutting. Furthermore, lead bending is performed as necessary.

Figure 5:
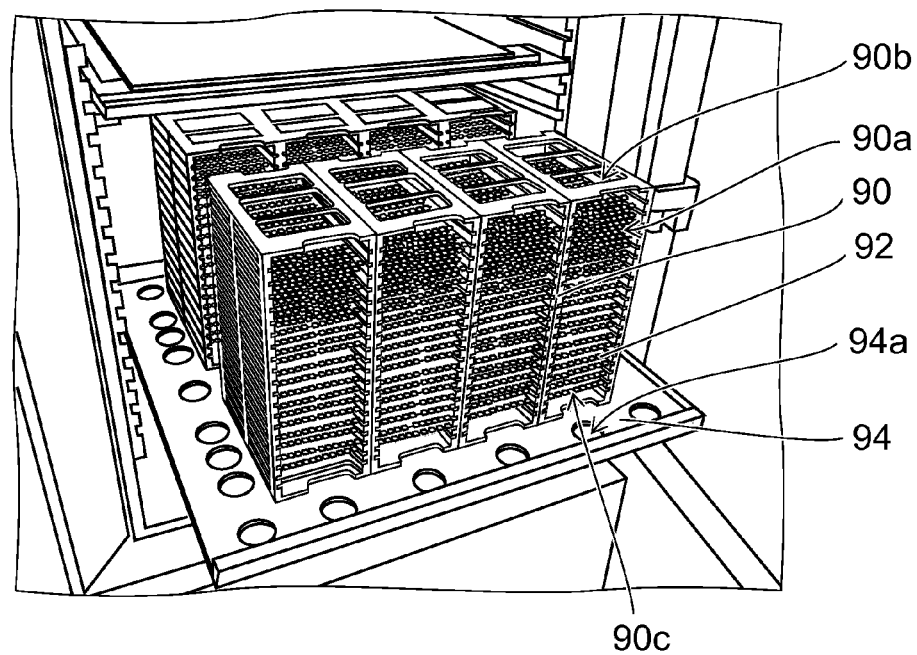
FIG. 5 is a photograph showing magazines housed in the processing chamber of the radio frequency plasma irradiation apparatus.

FIG. 5 is a photograph showing magazines housed in the processing chamber of the radio frequency plasma irradiation apparatus.

A plurality of magazines 90 are provided with slit-shaped openings 90a in the side surface and openings 90b, 90c also on top and bottom. For instance, the ground electrode 94 of the radio frequency plasma apparatus is also provided with openings 94a. The opening 90c of the magazine is aligned with the opening 94a of the ground electrode 94. If the gas flow rate in the processing chamber is set to a low level, the mean free path of electrons is made longer, and the electrical discharge is made uniform. Thus, the reaction in the processing chamber can be made uniform. This can improve the productivity of the plasma processing step.

Figure 6:
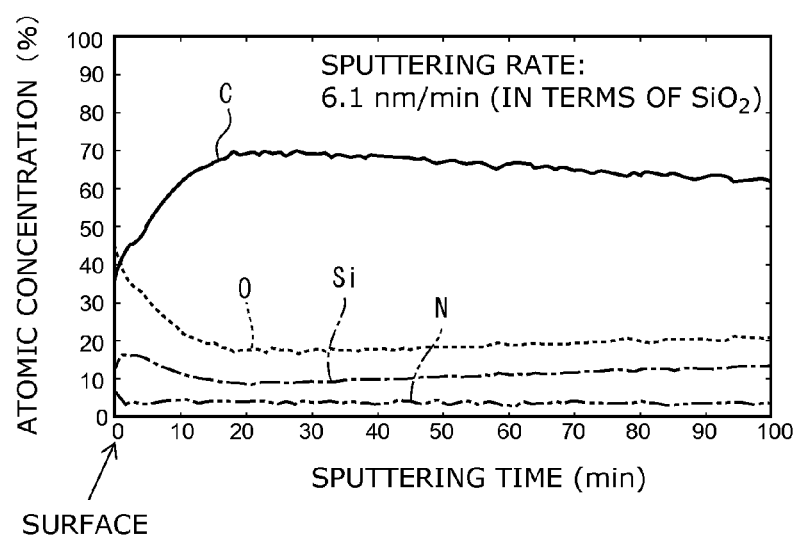
FIG. 6 is a graph in which the composition in the depth direction from the surface of the inner resin layer after plasma processing is analyzed using XPS in the photocoupler according to the first embodiment.

FIG. 6 is a graph in which the composition in the depth direction from the surface of the inner resin layer after plasma processing is analyzed using XPS in the photocoupler according to the first embodiment.

The vertical axis represents atomic concentration (%). The horizontal axis represents sputtering time (min). The sputtering time represented on the horizontal axis corresponds to the depth from the surface. For instance, in the case of $SiO_2$, the sputtering rate is e.g. generally 6 nm/min. Thus, the composition in the depth direction of the resin layer can be analyzed using X-ray photoelectron spectroscopy (XPS).

By surface modification by plasma processing, the C (carbon) atomic concentration at the surface of the inner resin layer 40 is made lower than the internal atomic concentration. For instance, the surface C atomic concentration is generally 40%, whereas the internal C atomic concentration after the lapse of a sputtering time of 100 minutes is generally 62%. More specifically, on the surface side, C atoms are more volatile by decomposition by oxygen plasma. This decreases the C atomic concentration. On the other hand, the oxygen plasma oxidizes other atoms. This increases the oxygen elemental concentration to generally 40%.

Ratio of oxygen atomic concentration to silicon atomic concentration decreases with distance in depth direction of the inner resin layer from an interface between the inner resin layer and the outer resin layer.

Ratio among silicon atomic concentration, oxygen atomic concentration, and carbon atomic concentration changes with distance in depth direction of the inner resin layer from an interface between the inner resin layer and the outer resin layer.

The Si (silicon) atomic concentration at the surface does not become higher than the internal atomic concentration.

The Si atomic concentration is 10-16%. That is, in the case where the filler contains Si, part of the filler is exposed at the surface of the inner resin layer 40. Thus, the adhesiveness can be enhanced by the exposed inorganic filler and the outer resin layer 50.

Figure 7:
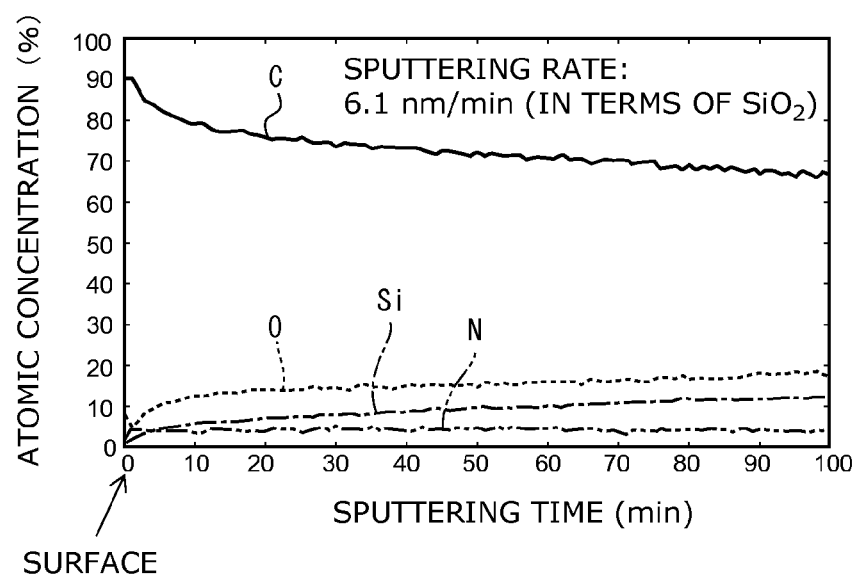
FIG. 7 is a graph in which the composition in the depth direction from the surface of the inner resin layer after plasma processing is analyzed using XPS in the photocoupler according to the comparative example.

FIG. 7 is a graph in which the composition in the depth direction from the surface of the inner resin layer after plasma processing is analyzed using XPS in the photocoupler according to the comparative example.

No plasma processing is performed in the comparative example. At the surface of the inner resin layer 140, the C elemental concentration is as high as generally 90%. With the distance from the surface, the C atomic concentration decreases to 70% or less. The O (oxygen) atomic concentration is generally zero at the surface, and increases to generally 18% with the distance from the surface.

The Si atomic concentration is generally zero at the surface, and increases to generally 12% with the distance from the surface. Thus, the atomic concentration distribution near the surface changes the concentration of elements constituting the inner resin layer 40 by plasma processing. This can provide surface modification. Also after sealing with the outer resin 50, the inner resin layer 40 partially takes over the tendency of the increase of C atomic concentration and the increase of oxygen atomic concentration, and in particular the tendency of the decrease of the ratio of the oxygen atomic concentration to the Si atomic concentration, with the distance in the depth direction of the inner resin layer 40 from the interface FI between the inner resin layer 40 and the outer resin layer 50. That is, the inner resin layer 40 includes a region where the ratio among the Si atomic concentration, the oxygen atomic concentration, and the carbon atomic concentration changes with the distance in the depth direction of the inner resin layer 40 from this interface FI.

Figure 8:
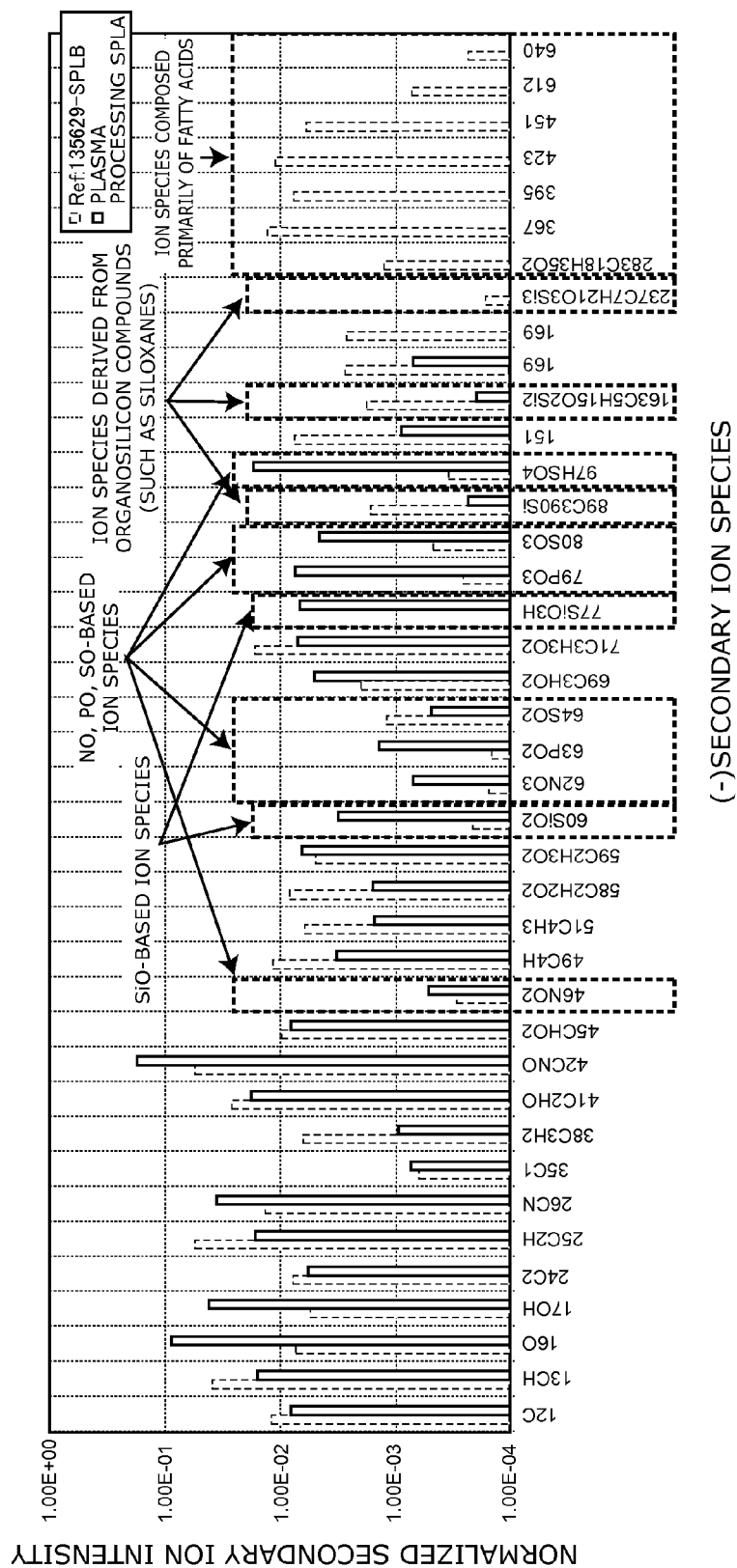
FIG. 8 is a graph showing the secondary ion intensity by TOF-SIMS at the surface subjected to plasma irradiation.

FIG. 8 is a graph showing the secondary ion intensity by TOF-SIMS at the surface subjected to plasma irradiation.

The vertical axis represents the normalized secondary ion intensity. The horizontal axis represents the secondary ion species. TOF-SIMS (time of flight secondary ion mass spectrometry) can extract a three-dimensional image and a two-dimensional image of an arbitrary site. The dashed line represents the value before plasma processing. The solid line represents the value after plasma processing.

The inner resin layer 40 is a resin in which a base resin containing isocyanuric acid and having an epoxy group is polymerized with a curing agent containing an acid anhydride having an acid anhydride group.

The inner resin layer 40 often further includes a release agent and various reaction agents made of organic materials such as fatty acids. These organic materials may be segregated from inside and localized at the surface of the inner resin 40. For instance, in this figure, secondary ion species including $(CH_2)_n$ are included in fatty acids. For instance, the composition formula of stearic acid, which is one of fatty acids, is $CH_3(CH_2)_{16}COOH$.

Furthermore, organosilicon compounds such as siloxanes exist in the process for manufacturing the photocoupler. In this figure, $C_3H_9OSi$, $C_5H_{15}O_2Si$, $C_7H_{21}O_3Si_3$ and the like may be attached to the surface of the inner resin 40 in the manufacturing process.

The adhesiveness decreases if the organic materials segregated at the surface of the inner resin 40 and the organic materials attached to the surface of the inner resin 40 exist at the resin interface FI. For instance, in the comparative example, the adhesion strength may be lower than 35 N. In contrast, in this embodiment, the fatty acids segregated at the surface and the organosilicon compounds attached to the surface are volatilized with part of the inner resin 40 by plasma processing. On the other hand, the concentration of the filler such as $SiO_2$ becomes relatively higher. Thus, the adhesiveness between the inner resin layer 40 and the outer resin layer 50 increases to 55 N or more. Here, the condition of the plasma processing step (such as radio frequency power and time) can be determined from the analysis result of FIG. 8.

As a result, peeling at the resin interface is suppressed. Oxidation of the resin layer due to absorption of water/moisture is suppressed. Resin discoloration is also suppressed. Furthermore, the surface of the inner resin 40 is ground by plasma processing. This may further enhance the adhesiveness.

The photocoupler of this embodiment has higher reliability because resin peeling is suppressed in an environment at high temperature and high humidity. Such a photocoupler can be widely used in industrial equipment, air conditioners, electronic equipment and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A photocoupler comprising:
a light emitting element driven by an input electrical signal;
a light receiving element configured to convert emission light of the light emitting element into an electrical signal for output;
an inner resin layer including a base resin and a curing agent, the base resin containing isocyanuric acid having an epoxy group, the curing agent containing an acid anhydride having an acid anhydride group, the inner resin layer covering the light emitting element and the light receiving element; and
an outer resin layer enclosing the inner resin layer and configured to block the emission light,
carbon atomic concentration increasing and oxygen atomic concentration decreasing with distance in depth direction of the inner resin layer from an interface between the inner resin layer and the outer resin layer.

2. The photocoupler according to claim 1, wherein
the inner resin layer and the outer resin layer each include an inorganic filler containing silicon, and
the inorganic filler of the inner resin layer is exposed at the interface.

3. The photocoupler according to claim 2, wherein
the inner resin layer is blended with a first inorganic filler at a first blending ratio of 60 weight % or more and 85 weight % or less,
the outer resin layer is blended with a second inorganic filler at a second blending ratio of 60 weight % or more and 85 weight % or less, and
difference between the first blending ratio and the second blending ratio is 5 weight % or more and 12 weight % or less.

4. The photocoupler according to claim 1, wherein
the isocyanuric acid includes 1,3,5-tris(2,3-epoxypropyl) isocyanuric acid, and the acid anhydride includes isomethyltetrahydrophthalic acid anhydride.

5. A photocoupler comprising:

a light emitting element driven by an input electrical signal;

a light receiving element configured to convert emission light of the light emitting element into an electrical signal for output;

an inner resin layer including a base resin and a curing agent, the base resin containing isocyanuric acid having an epoxy group, the curing agent containing an acid anhydride having an acid anhydride group, the inner resin layer covering the light emitting element and the light receiving element; and an outer resin layer enclosing the inner resin layer and configured to block the emission light, ratio of oxygen atomic concentration to silicon atomic concentration decreasing with distance in depth direction of the inner resin layer from an interface between the inner resin layer and the outer resin layer.

6. The photocoupler according to claim 5, wherein the inner resin layer and the outer resin layer each include an inorganic filler containing silicon, and the inorganic filler of the inner resin layer is exposed at the interface.

7. The photocoupler according to claim 6, wherein the inner resin layer is blended with a first inorganic filler at a first blending ratio of 60 weight % or more and 85 weight % or less, the outer resin layer is blended with a second inorganic filler at a second blending ratio of 60 weight % or more and 85 weight % or less, and difference between the first blending ratio and the second blending ratio is 5 weight % or more and 12 weight % or less.

8. The photocoupler according to claim 5, wherein the isocyanuric acid includes 1,3,5-tris(2,3-epoxypropyl) isocyanuric acid, and the acid anhydride includes isomethyltetrahydrophthalic acid anhydride.

9. A photocoupler comprising:

a light emitting element driven by an input electrical signal;

a light receiving element configured to convert emission light of the light emitting element into an electrical signal for output;

an inner resin layer including a base resin and a curing agent, the base resin containing isocyanuric acid having an epoxy group, the curing agent containing an acid anhydride having an acid anhydride group, the inner resin layer covering the light emitting element and the light receiving element; and an outer resin layer enclosing the inner resin layer and configured to block the emission light, ratio among silicon atomic concentration, oxygen atomic concentration, and carbon atomic concentration changing with distance in depth direction of the inner resin layer from an interface between the inner resin layer and the outer resin layer.

10. The photocoupler according to claim 9, wherein the inner resin layer and the outer resin layer each include an inorganic filler containing silicon, and the inorganic filler of the inner resin layer is exposed at the interface.

11. The photocoupler according to claim 10, wherein the inner resin layer is blended with a first inorganic filler at a first blending ratio of 60 weight % or more and 85 weight % or less, the outer resin layer is blended with a second inorganic filler at a second blending ratio of 60 weight % or more and 85 weight % or less, and difference between the first blending ratio and the second blending ratio is 5 weight % or more and 12 weight % or less.

12. The photocoupler according to claim 9, wherein the isocyanuric acid includes 1,3,5-tris(2,3-epoxypropyl) isocyanuric acid, and the acid anhydride includes isomethyltetrahydrophthalic acid anhydride.

\* \* \* \* \*